United States Patent
Zeng et al.

(10) Patent No.: US 12,195,841 B2
(45) Date of Patent: Jan. 14, 2025

(54) METHOD FOR COATING FILM BY PULSED LASER DEPOSITION WITH PLASMA GRATING

(71) Applicants: Chongqing Huapu Scientific Instrument Co., Ltd., Chongqing (CN); ROI Optoelectronics Technology CO, LTD., Shanghai (CN); Yunnan Huapu quantum Material Co., Ltd, Yunnan (CN); Chongqing Huapu Quantum Technology Co., Ltd., Chongqing (CN); East China Normal University, Shanghai (CN); Chongqing Institute of East China Normal University, Chongqing (CN)

(72) Inventors: Heping Zeng, Chongqing (CN); Mengyun Hu, Chongqing (CN); Yu Qiao, Chongqing (CN)

(73) Assignees: CHONGQING HUAPU SCIENTIFIC INSTRUMENT CO., LTD., Chongqing (CN); ROI OPTOELECTRONICS TECHNOLOGY CO, LTD., Shanghai (CN); YUNNAN HUAPU QUANTUM MATERIAL CO., LTD, Yunnan (CN); CHONGQING HUAPU QUANTUM TECHNOLOGY CO., LTD., Chongqing (CN); EAST CHINA NORMAL UNIVERSITY, Shanghai (CN); CHONGQING INSTITUTE OF EAST CHINA NORMAL UNIVERSITY, Chongqing (CN)

( * ) Notice: Subject to any disclaimer, the term of this patent is extended or adjusted under 35 U.S.C. 154(b) by 8 days.

(21) Appl. No.: 18/353,655

(22) Filed: Jul. 17, 2023

(65) Prior Publication Data
US 2024/0026523 A1 Jan. 25, 2024

(30) Foreign Application Priority Data

Jul. 19, 2022 (CN) .......................... 202210851047.3

(51) Int. Cl.
*C23C 14/28* (2006.01)
*C23C 14/54* (2006.01)

(52) U.S. Cl.
CPC .............. *C23C 14/28* (2013.01); *C23C 14/54* (2013.01)

(58) Field of Classification Search
CPC ........ C23C 14/28; C23C 14/54; C23C 16/483
See application file for complete search history.

(56) References Cited

U.S. PATENT DOCUMENTS

| 2011/0193025 A1* | 8/2011 | Ichikawa | ............... C09K 11/08 501/153 |
| 2017/0350000 A1* | 12/2017 | Kekkonen | ............ B23K 26/361 |

(Continued)

OTHER PUBLICATIONS

Okoshi, Masayuki, et al., "Pulsed laser deposition of ZnO thin films using a femtosecond laser". Applied Surface Science, 154-155 (2000) 424-427.*

(Continued)

*Primary Examiner* — Bret P Chen
(74) *Attorney, Agent, or Firm* — Hodgson Russ LLP

(57) ABSTRACT

A method for film coating by pulsed laser deposition with a plasma grating includes: in step 1, providing a substrate and a target material; in step 2, generating a femtosecond pulsed laser beam which is split by a beam splitting module so as to form a plurality of femtosecond pulsed laser sub-beams; in step 3, performing a first excitation on the target material by one of the split femtosecond pulsed laser sub-beams as a pre-pulse after focus, to generate a first plasma; in step 4, synchronizing the rest of the split femtosecond pulsed laser sub-beams as post-pulses to form, after focus, filaments (Continued)

arriving at a surface of the target material simultaneously, to generate the plasma grating; and in step 5, performing a secondary excitation on the target material by the generated plasma grating to generate a second plasma depositing on the substrate to form the film.

9 Claims, 6 Drawing Sheets

(56) References Cited

U.S. PATENT DOCUMENTS

2021/0323814 A1* 10/2021 Zeng .................... B81C 1/00531
2021/0325581 A1* 10/2021 Zeng ..................... G03F 7/2053

OTHER PUBLICATIONS

Okamuro, Kiminori, et al., "Laser fluence dependence of periodic grating structures formed on metal surfaces under femtosecond laser pulse irradiation". Physical Review B 82, 165417 (2010) pp. 1-5.*

Garrelie, Florence, et al., "Control of femtosecond pulsed laser ablation and deposition by temporal pulse shaping". Optics & Laser Technology 78 (2016) 42-51.*

Edwards, Matthew R., et al., "Plasma Transmission Gratings for Compression of High-Intensity Laser Pulses". Physical Review Applied 18, 024026 (2022), pp. 1-12.*

* cited by examiner

METHOD FOR COATING FILM BY PULSED LASER DEPOSITION WITH PLASMA GRATING

CROSS-REFERENCE TO RELATED APPLICATIONS

The application claims priority to Chinese Patent Application No. 202210851047.3, filed on Jul. 19, 2022, the entire disclosure of which is incorporated herein by reference.

FIELD

The present disclosure relates to the technical field of film coating, specifically to a method for coating a film by pulsed laser deposition with a plasma grating.

BACKGROUND

The film coating technique is to coat one or more thin layers of metal, semiconductor or ceramic materials on surfaces of a target substrate to enhance the performance of the substrate so as to meet the needs of specific applications. Traditional coating technology may be mainly divided into chemical and physical methods, where the physical method mainly includes low-energy beam cluster deposition, vacuum evaporation, physical vapor deposition, molecular beam and atomic beam epitaxies and molecular self-assembly technology, etc.; and the chemical method mainly includes sol-gel method, chemical vapor deposition and electro deposition. The traditional coating methods generally have the disadvantages of complex manufacturing process, high cost and time consuming.

Pulse Laser Deposition (PLD) is a technique that uses pulsed lasers to excite the target material, generating a high-temperature, high-pressure plasma which is ejected in the direction normal to that of the target material and deposited onto the substrate to form a thin film. It can be roughly divided into four stages as follows: (i) stage 1: interaction of the laser radiation with the target material; (ii) stage 2: dynamic diffusion of molten materials; (iii) stage 3: deposition of the molten materials on the substrate; and (iv) stage 4: nucleation and generation of the thin film on the surface of the substrate. Compared with the traditional coating methods, PLD has the advantages of simple process, low temperature required for a deposition and being able to make microstructure and multi-component films. Therefore, it has become one of the most promising film-making technologies.

Although the pulsed laser deposition for films presents powerful advantages, there are still some complex difficulties to be overcome. For example, for a considerable number of materials, there are frequently small molten particles or target material fragments included in the films produced by the pulsed laser deposition, which are due to an incomplete interaction between the laser and the target material in the first stage, resulting in the expansive material with small particles, and the presence of these particles greatly reduces the quality of formed films. In addition, limited by output energy of a laser device, such a technique has been unable to achieve a large-area deposition, and it meanwhile presents slow average deposition speed, and is only suitable for microelectronics, sensor technology, optical technology and other high-tech fields and the research and development of new material films, showing certain limitations.

SUMMARY

The present disclosure aims at providing a method of film coating by pulsed laser deposition with a plasma grating, to solve the problem of unsatisfactory quality of a film produced by PLD in the related art.

For this, the present disclosure provides a method of coating a film by pulsed laser deposition with a plasma grating in embodiments, including:

in step 1, providing a substrate and a target material in a vacuum chamber;

in step 2, generating, by a femtosecond laser device, a femtosecond pulsed laser beam which is split by a beam splitting module so as to form a plurality of femtosecond pulsed laser sub-beams;

in step 3, performing a first excitation on the target material by one of the split femtosecond pulsed laser sub-beams as a pre-pulse entering the vacuum chamber after focus, so as to generate a first plasma;

in step 4, synchronizing the rest of the split femtosecond pulsed laser sub-beams as post pulses with a delay synchronization module to form, after focus, filaments arriving at a surface of the target material simultaneously, to generate the plasma grating in the first plasma generated by the first excitation of the pre-pulse; and in step 5, performing a secondary excitation on the target material by the generated plasma grating to generate a second plasma which deposits on the substrate to form the film partially after reaching to the substrate, and moving the target material relative to the substrate so as to form the film in a large area by deposit.

The principle and advantages of the solutions above are as follows.

i. In embodiments of the present disclosure, for the problem of unsatisfactory film quality produced by PLD in the related art, the inventors of the disclosure upgraded the PLD, and first put forward a concept for replacing the traditional pulsed lasers with an ultrafast femtosecond plasma grating for the film coating. During the R&D process, the technical difficulty lies on the synchronization between a plurality of femtosecond pulsed laser beams in time domain to form the plasma grating, which requires controlling the optical path of multiple pulsed lasers within a precision of 0.001 mm, and to excite the target material on its surface.

ii. In embodiments of the present disclosure, the femtosecond pulsed laser is used, which has advantages of small heat affected area, high processing precision and being able to process fine and complex structures.

iii. In embodiments of the present disclosure, the use of a one-dimensional or two-dimensional plasma grating that is formed by multiple filaments via small angles therebetween to excite the target material eliminates the power clamping effect of a single filament beam, thus significantly improving the electron density and optical power density in plasma channels. Further, the plasma inside the formed plasma grating has a higher temperature, greater pressure and a periodic structure, thus achieving an excitation with multiple point sources which increases areas of the target material to be excited and effectively reduces the influence caused by the inhomogeneous target material matrix, as well as achieves better precision of the coating thickness controlling.

iv. In embodiments of the present disclosure, two excitation mechanisms, an electron excitation and a multiphoton excitation, work together on the target material, which can achieve effective excitations for super-hard materials, super-stable oxides, ceramics and other materials, and can reduce the number of small-particle clusters formed in the plasma thereby improving the quality of the film, and can increase the number of atoms and ions at high energy levels to assist the formation of the film with nanocrystalline structures and mesoporous structures.

v. In embodiments of the present disclosure, the formed femtosecond plasma grating has a certain length and is very stable, which reduces the influence caused by the unevenness of the target material surface on the excitation efficiency during processing, thereby increasing the uniformity of the film coating.

In summary, the technical solution provided in the present disclosure can effectively overcome multiple shortcomings in the PLD so as to improve the production efficiency of the coating industry, and to meet some of the special coating needs, thus promoting the development of microelectronic devices, cell phone screens, display screens and protective film and other related industries, with significant economic benefits and promotional applications.

In some embodiments of the present disclosure, as an improvement, in the step 2, the split femtosecond pulsed laser sub-beam possesses single pulse energy greater than 0.5 mJ, a repetition frequency of 1 kHz-1 MHz, a femtosecond pulse width of 10-500 fs, and center wavelengths of 200-400 nm of the ultraviolet band, 400-700 nm of the visible band and 700-2500 nm of the infrared band.

In embodiments of the present disclosure, the energy of the femtosecond laser has a significant impact on excitation efficiency and excitation effect. The single pulse energy of the femtosecond laser must be high enough to form a plasma grating and to present the superiority of the plasma grating, while the coating effect is not apparently under low energy conditions. The repetition frequency is related to the efficiency of coating in a large area. The higher the repetition frequency, the more pulses per unit time, such that a faster scanning coating can be achieved with the sample movement speed increasing. The pulse width of the femtosecond is also related to the formation of the plasma grating. Generally, the formation of the plasma grating is based on the laser power density that equals to the laser energy divided by the pulse width and then divided by the spot size. The larger this value, the more helpful to form the plasma grating. Accordingly, pulses with long pulse width require higher laser energy to form the plasma grating, but its corresponding coating effect is also difficult to achieve in the case of using pulses with short pulse width. The central wavelength of a laser is related to the energy of photons. The shorter the wavelength of photons, the greater the energy of the photons, and the stronger the ability to ionize and excite the target material. In embodiments of the present disclosure, the single pulse energy of the split femtosecond laser which is obtained by splitting a femtosecond laser output by a femtosecond laser device is greater than 0.5 mJ to ensure the formation of femtosecond filaments. The plasma (i.e. the first plasma) formed by a first excitation on the target material with femtosecond pre-pulses can assist in the formation of the plasma grating with multiple post pulses to achieve a secondary excitation. The secondary excitation by the plasma grating can effectively help to reduce the clusters in the plasma generated in the first excitation by the pre-pulses, thereby improving the uniformity of the coating.

In some embodiments of the present disclosure, as an improvement, an interval between the first excitation of the pre-pulse and the second excitation of the post pulse is 1 ps to 100 ns.

In embodiments of the present disclosure, the pre-pulse may be a picosecond pulse that is expanded from a femtosecond pulse in time domain or output by a high-energy picosecond laser device. The interval between the first excitation of the pre-pulse and the second excitation of the post pulse may be regulated as within 1 ps-100 ns to achieve better excitation effects and improve coating uniformity. The delay synchronization module is used for a precise adjustment to the optical path of the pulse, and such an adjustment may be implemented by a stepper motor, where an equal optical path results in pulse synchronization while an optical path difference results in pulse delay.

In some embodiments of the present disclosure, as an improvement, in the step 4, the filaments form an included angle of 5-20°.

In embodiments of the present disclosure, the formed filaments may intersect non-collinearly in a same plane to form a one-dimensional plasma grating, or may intersect at small included angles such as 5-20° in different planes to form a two-dimensional plasma grating. When multiple femtosecond pulses, after focus, intersect at small included angles, there are interactions in overlapping regions, resulting in interference to form a periodic intensity distribution. In regions of constructive interference, due to the Kerr effect, the light intensity further increases, and the plasma grating is firstly generated here and reaches equilibrium with the Kerr effect, forming spatially periodic distributed plasma channels.

In some embodiments of the present disclosure, as an improvement, in the step 4, a spatial length of the plasma grating is 1 mm.

In embodiments of the present disclosure, the plasma grating has a certain spatial length around 1 mm, which can effectively overcome the instability caused by irregular target material surfaces, and the target material only needs to be fixed near a focal point of a lens.

In some embodiments of the present disclosure, as an improvement, in the step 5, a distance between the substrate and the target material is 1-5 cm, the substrate and the target material are controlled to move at a speed of 20-30 mm/s. In some embodiments, the target material is controlled to move at a speed of 20-30 mm/s relative to the substrate.

In embodiments of the present disclosure, there is a certain distance between the substrate and the target material to prevent the substrate from negative effects caused by the formed plasma with a high temperature and high pressure, and to enable plasmas to deposit on the substrate in plenty, where the distance is 1-5 cm and may be adjusted according to properties of the target material as well as the laser energy. The distance may be adjusted by moving the spatial position of the substrate, as the target material should be provided near the focal point of the lens during the whole excitation to ensure it to be excited within the plasma grating and thus the spatial position of the target material cannot be changed. In addition, the moving speeds of the substrate and the target material have a great impact on the film formation, and the moving speeds work in conjunction with parameters of the lasers. The substrate and the target material moving at a speed of 20-30 mm/s, especially the substrate moving relative to the target material a speed of 20-30 mm/s, can realize large-scale area coating and can avoid pits formed by excitation on the target material at same positions. By setting different moving speeds to control the thickness of the film, and due to the excitation with multiple point sources of the plasma grating, the accuracy of thickness controlling is significantly enhanced.

In some embodiments of the present disclosure, as an improvement, in the step 1, the vacuum chamber is provided with a protective gas, wherein the protective gas is argon.

In embodiments of the present disclosure, several amounts of rare gases (i.e. protective gases) may be provided during the process, such as argon, to further increase the electron density and optical power density in the plasma grating. The plasma grating formed in the rare gases performs excitation on the target material, and the target material is protected from air oxidation due to inert propriety of the rare gases, thereby improving efficiency of film forming.

In some embodiments of the present disclosure, as an improvement, the beam splitting module comprises a plurality of beam splitters.

In embodiments of the present disclosure, the femtosecond pulsed laser may be split by the beam splitting module which has simple structures and is easy to operate.

In some embodiments of the present disclosure, as an improvement, the delay synchronization module comprises a plurality of reflectors and lenses.

In embodiments of the present disclosure, a femtosecond pulsed laser is split by the beam splitting module to generate a plurality of femtosecond pulsed laser sub-beams, and these femtosecond pulsed laser sub-beams are individually reflected by the reflector and focalized by the lens, thereby achieving a delay time.

BRIEF DESCRIPTION OF THE DRAWINGS

FIG. 11 shows a comparison of plasmas excited by a single filament and by a one-dimensional plasma grating, in which FIG. 11a is a photograph of an excitation by the filament while FIG. 11b is a photograph of an excitation by the plasma grating.

DETAILED DESCRIPTION

Figure 1:
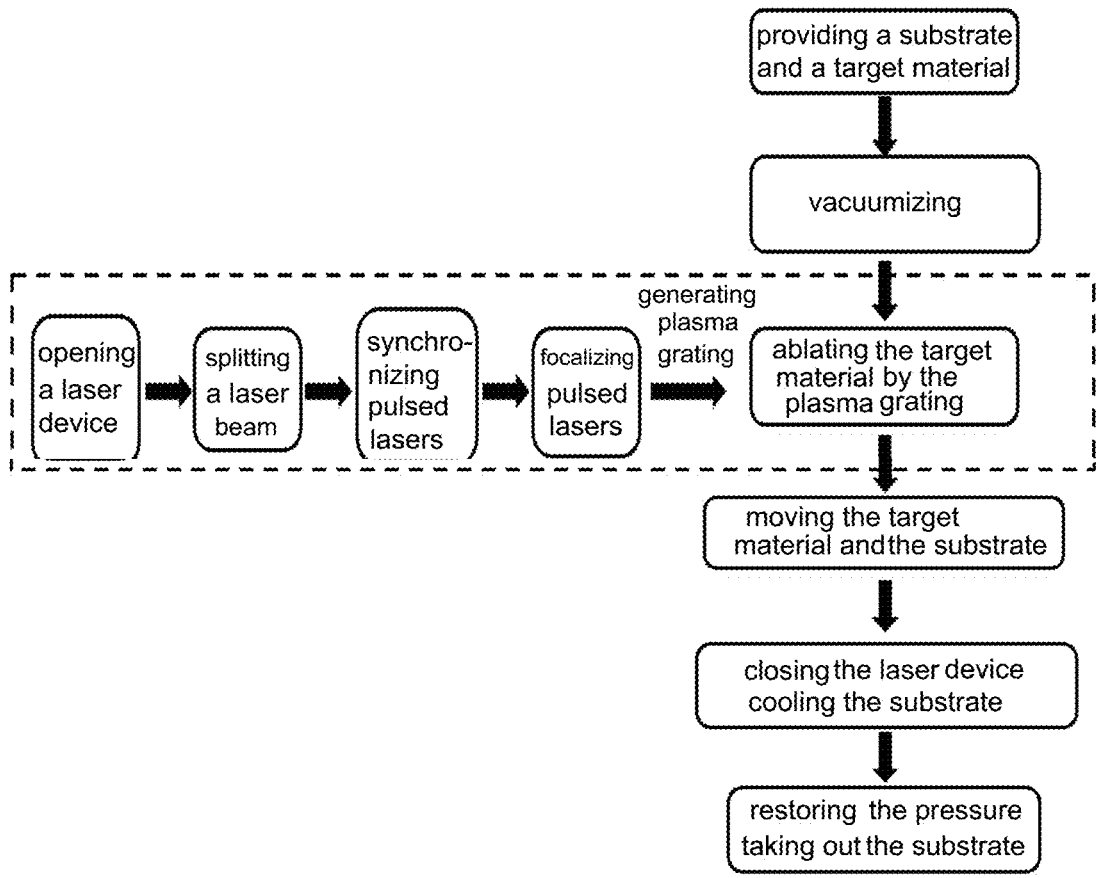
FIG. 1 is a block diagram showing a process of a method of film coating by an ultrashort-pulsed laser deposition with a plasma grating.

Reference will be made in detail to embodiments of the present disclosure, but the embodiments of the present disclosure are not limited to these. If not particularly specified, the technical means used in the following embodiments are well-known conventional means for those skilled in the art; the experimental methods used are all conventional methods; the materials, reagents, etc. used can be commercially available; and the content mentioned in the embodiments is not a limitation of the present disclosure.

References in the drawings includes: 1—femtosecond laser device; 2—shutter; 3—attenuator; 4—reflector A; 5—beam splitter A; 6—reflector B; 7—reflector C; 8—stepper motor A; 9—reflector D; 10—reflector E; 11—beam splitter B; 12—stepper motor B; 13—reflector F; 14—reflector G; 15—reflector H; 16—reflector I; 17—reflector J; 18—lens A; 19—lens B; 20—lens C; 21—load platform A; 22—target material; 23—glass substrate; 24—load platform B; 25—deposition chamber; 26—window of the deposition chamber; 27—gas inlet.

SCHEME

Figure 9:
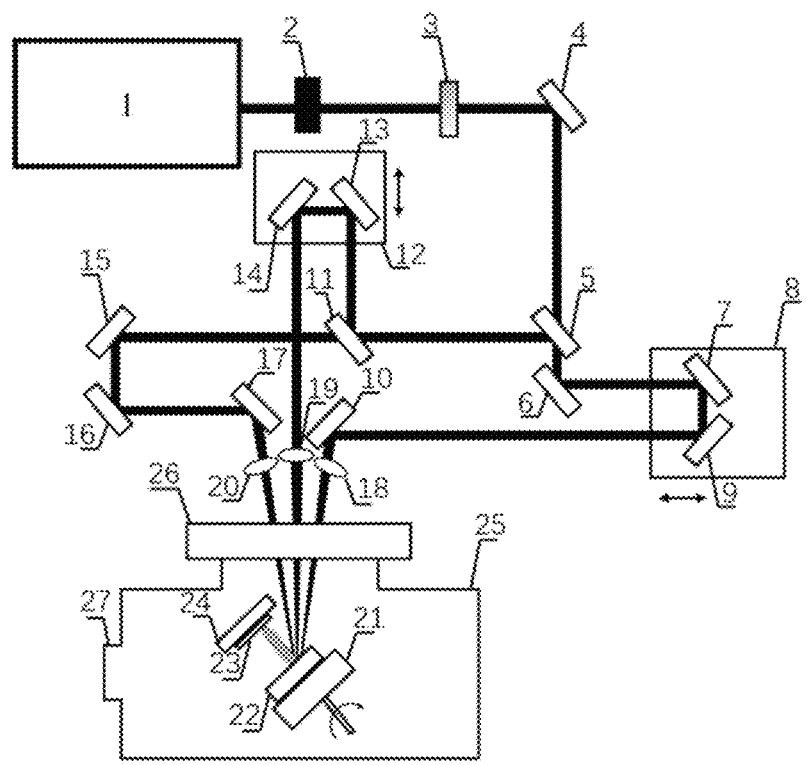
FIG. 9 is a schematic diagram showing a device for film coating by an ultrashort-pulsed laser deposition with a plasma grating.

Embodiments of the present disclosure provides a method for coating a film by pulsed laser deposition with a plasma grating, which may be implemented by a device for film coating by an ultrashort-pulsed laser deposition with a plasma grating. As shown in FIG. 9, the device for film coating by an ultrashort-pulsed laser deposition with a plasma grating may include: a femtosecond laser device 1; a beam splitting module; a delay synchronization module, a vacuum chamber; and a load module. The femtosecond laser device 1 is connected to a shutter 2 to control its open and close. The beam splitting module includes an attenuator 3, a reflector A 4, a beam splitter A 5 and a beam splitter B 11. The delay synchronization module includes are reflector B 6, a reflector C 7, a reflector D 9, a reflector E 10, a reflector F 13, a reflector G 14, a reflector H 15, a reflector I 16, a reflector J 17, a lens A 18, a lens B 19, a lens C 20, a stepper motor A 8 and a stepper motor B 12. The load module includes a load platform A 21 and a load platform B 24 which are arranged in a deposition chamber 25 and configured to load a target material 22 and a glass substrate 23 respectively. The deposition chamber 25 is provided with a window 26 and a gas inlet 27.

As shown in FIG. 1, the method for film coating may include the following steps 1-6.

In step 1, a substrate and a target material are provided in a vacuum chamber which is then vacuumized and maintained in a low pressure vacuum condition.

In step 2, start a femtosecond laser device with parameters set to output a femtosecond pulsed laser beam, and the femtosecond pulsed laser is then split to generate a plurality of femtosecond pulsed laser sub-beams.

In step 3, one of the split femtosecond pulsed laser sub-beams, as a pre-pulse, enters the vacuum chamber after focus and performs a first excitation on the target material loaded at a load module, so as to generate a first plasma.

In step 4, the rest of the split femtosecond pulsed laser sub-beams, as post pulses, are synchronized by a delay synchronization module and are focalized to form filaments which arrive at a surface of the target material simultaneously and intersect at small included angles to interact in the first plasma generated by the first excitation of the pre-pulse, thereby generating a plasma grating.

In step 5, the generated plasma grating performs a secondary excitation on the target material to generate plenty of plasmas (i.e. second plasma) which is ejected in the direction normal to that of the target material to form plasma plume and to deposited onto the substrate, thereby achieving a film coating based on PLD; and by moving the target material relative to the substrate by controlling the load module, a uniform film is formed by deposit in a large area.

In step 6, with a completion of the film coating, the laser device is turned off, the pressure in the vacuum chamber is restored and the substrate is taken out at last.

Specifically, a femtosecond pulsed laser beam with a pulse width of 10-500 fs, a wavelength of 800 nm and a repetition frequency of 1 kHz is output by the femtosecond laser device. This femtosecond pulsed laser beam, after passing through the shutter and the attenuator, travels to the reflector A and then to the beam splitter A and the beam splitter B and is split into three femtosecond pulsed laser sub-beams (i.e. pulses A, B and C) with equal energy, where the pulse A passes along a delay optical path 1 including the reflectors B-E and the stepper motor A, and is concentrated by the lens A to form a filament; the pulse B passes along a delay optical path 2 including the reflectors F-G and the stepper motor B, and is concentrated by the lens B to form a filament; and the pulse C passes along an optical path including the reflectors H-J and is concentrated by the lens C to form a filament, and these filaments pass through the window of the deposition chamber and then intersect with each other near the focal point of the lens. The stepper motors A and B are adjusted, such that the pulses B and C have equal optical paths, thus ensuring their intersection so as to form the plasma grating, while the pulse A has a shorter optical path than that of the pulses B and C and thus arrives at the surface of the target material first to perform the first excitation, thereby producing a local plasma environment (i.e. the first plasma). The synchronization of optical paths for the pulses B and C may be adjusted according to brightness of their filaments respectively. The load platform A and the load platform B is movable in three dimensions, such that the target material could be controlled to be excited within the plasma grating, and could realize large-scale coating based on the movement of the load platforms.

Figure 10:
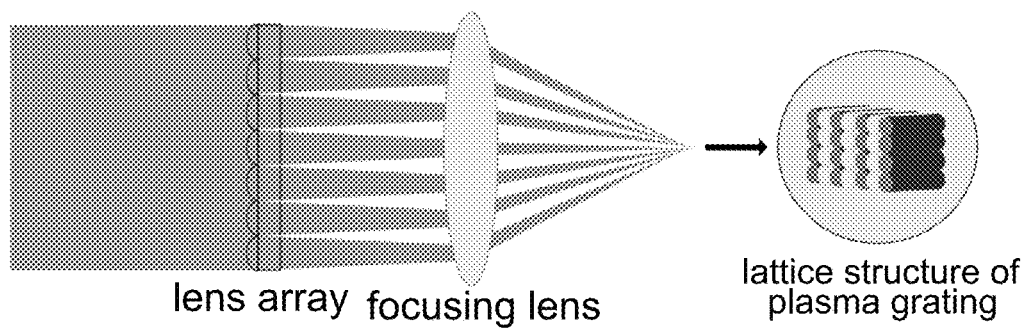
FIG. 10 is a schematic diagram showing a microlens array together with a focusing lens to form a plasma grating.

In addition, in order to effectively utilize laser energy and reduce the energy loss during laser beam splitting and reflection, the present disclosure provides a method of forming plasma gratings with the assistance of a microlens array. As shown in FIG. 10, the microlens array can divide the beam wavefront into many tiny parts in space, and each part is focused on the focal plane by the corresponding microlens. If the beam wavefront is an ideal planar wavefront, then a set of regular focal points can be presented on the focal plane of the microlens array, and then the laser beams are focalized and integrated by the concentration of a focusing lens, thus forming a plasma grating microstructure, thereby achieving a similar excitation effect.

Figure 2:
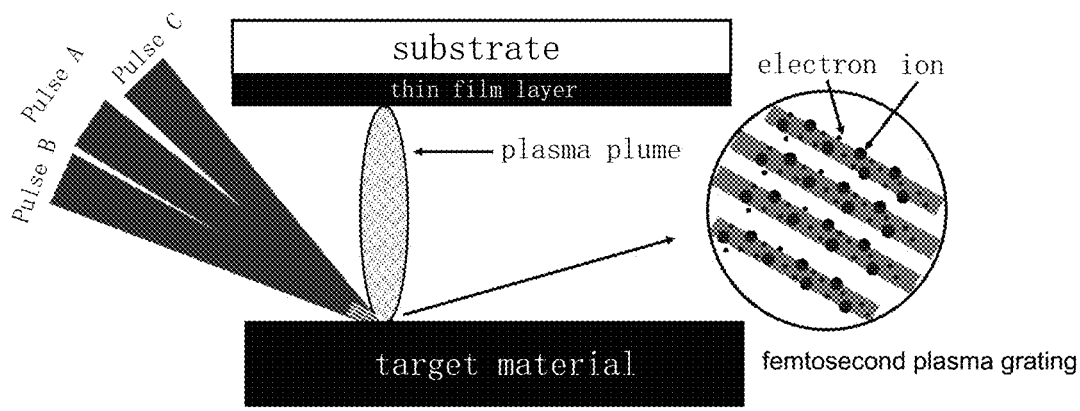
FIG. 2 is a schematic diagram showing a process of a method of film coating by an ultrashort-pulsed laser deposition with a plasma grating.

FIG. 2 is a schematic diagram showing a process of a method of film coating by an ultrashort-pulsed laser deposition with a plasma grating. As shown in FIG. 2, during the whole processing, the glass substrate is placed parallel to the target material, and there is a certain distance of 1-5 cm between them. During the processing, pulses A, B and C form filaments individually after focus. The pulse A, as the pre-pulse, arrives at the surface of the target material firstly and performs a first excitation on the target material, and then the pulses B and C, as the post pulses, arrive at the surface of the target material simultaneously and intersect at small included angles to interact, thus generating a plasma grating with a periodic structure. In the generated plasma grating, the femtosecond laser has a periodic structure of light and dark, and the plasma presents a periodic density distribution. The generated plasma grating performs a secondary excitation on the target material to generate plasma plume containing atoms and ions derived from the target material, which is ejected in the direction normal to that of the target material to the substrate, and to form a film locally after cooling. After that, by moving the target material and/or the substrate for the next excitation cycle, a large-area film is formed finally.

Figure 3:
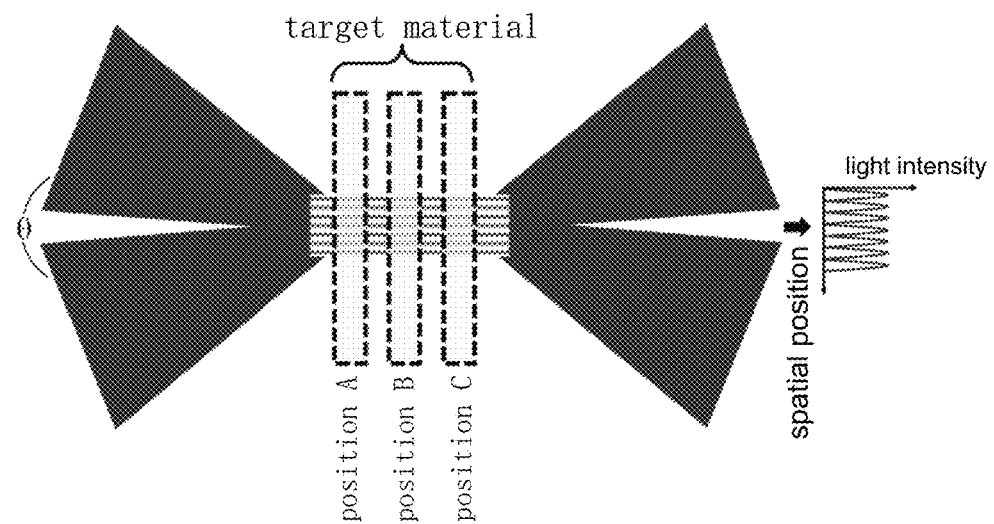
FIG. 3 is a schematic diagram showing a formulation of a plasma grating.
Figure 4:
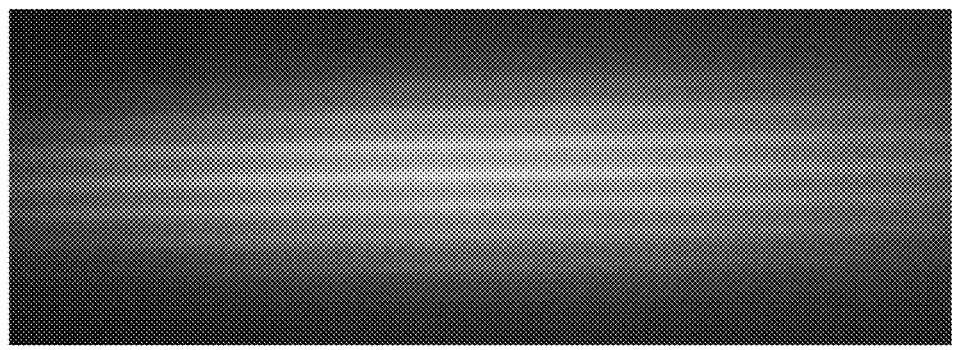
FIG. 4 is a photograph of a plasma grating.

FIG. 3 is a schematic diagram showing a formulation of the plasma grating. As shown in FIG. 3, when two femtosecond pulse beams, after focus, intersect at a small included angle θ, there are interactions in overlapping regions, resulting in interference to form a periodic intensity distribution. In regions of constructive interference, due to the Kerr effect, the light intensity further increases, and the plasma grating is firstly generated here and reaches equilibrium with the Kerr effect, forming spatially periodic distributed plasma channels (as shown in FIG. 4). Due to the interactions between the two beams, the light intensity sharply increases in regions of constructive interference with higher order nonlinear effects, making the optical power density in plasma channels break through the power clamping effect of a single filament beam and reach to a high level; and meanwhile, the electron density in plasma channels is also significantly increased, as more plasmas are needed to balance out the higher order nonlinear effects.

Figure 7:
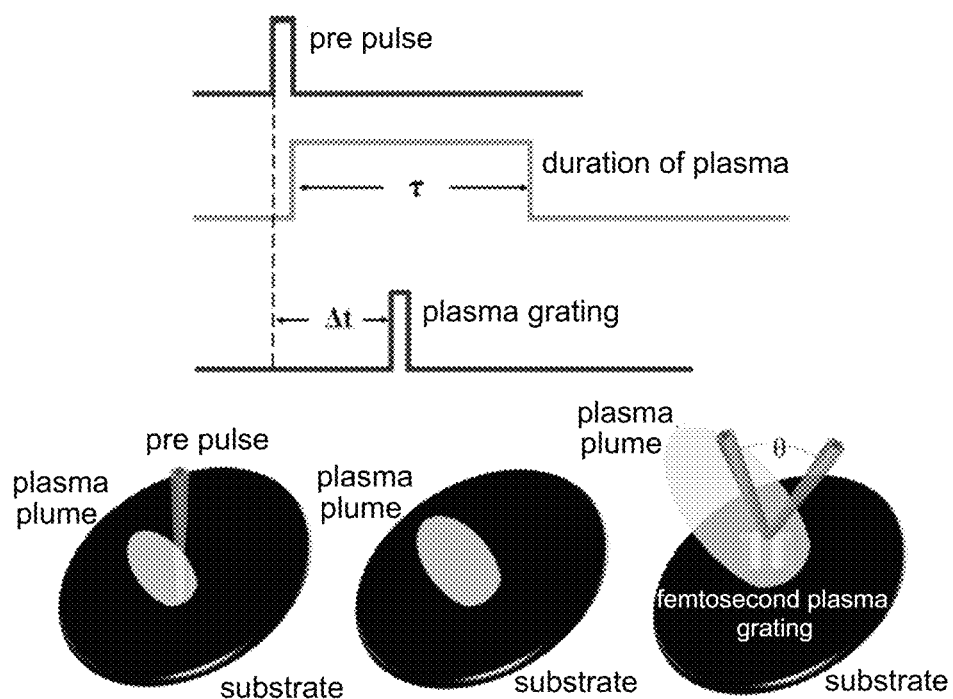
FIG. 7 is a schematic diagram showing a principle of a processing with a pre-pulse assisted a plasma grating.

FIG. 7 is a schematic diagram showing a principle of processing with a pre-pulse assisted a plasma grating. As shown in FIG. 7, in order to form the plasma grating better in a vacuum environment to perform effective excitations on the target material, the present disclosure provides a pre-heating method in embodiments. Specifically, a pre-pulse performs a first excitation on the surface of the target material at first to generate a certain amount of plasmas. Subsequently, a plurality of femtosecond pulsed laser sub-beams are incident simultaneously within the duration of the produced plasmas, and generate a plasma grating in the plasmas generated by the first excitation on the partial surface of the target material by the pre-pulse. The plasma grating then performs a secondary ablation on the target material and the produced plasmas, thus effectively reducing the number of particle clusters in the plasmas, thereby improving the quality of the film. The interval Δt between the incident time of the pre-pulse and that of the post pulse generating the secondary ablation, may be regulated within 1 ps-100 ns.

EXAMPLE 1

Influence of a Spatial Position a Target Material to be Excited at on Spectral Intensity of Plasma A generated plasma grating has a certain spatial length around 1 mm. In this Example, a target material was excited at different spatial positions with controlling other conditions unchanged, and a plasma spectrum was collected. The results are shown in FIG. 5.

Figure 5:
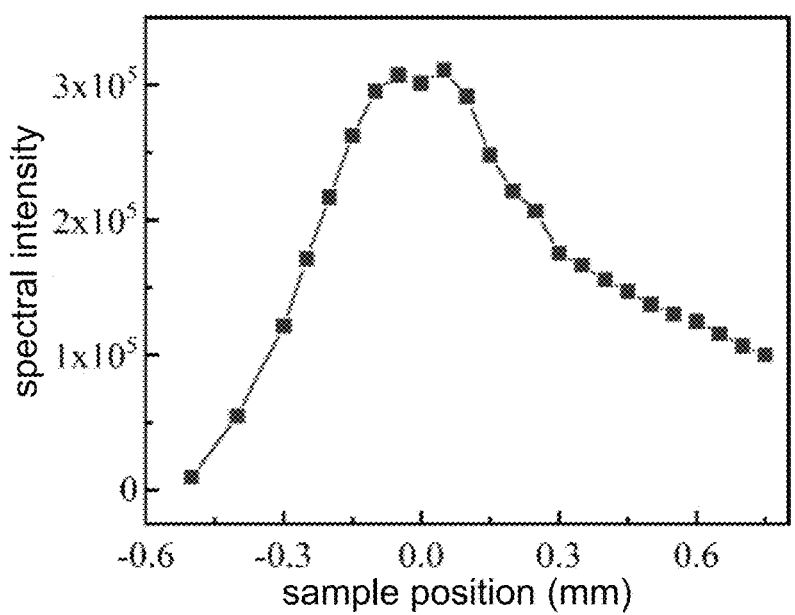
FIG. 5 is a graph showing that a position of a target material affects spectral intensity to excite the target material.

As shown in FIG. 5, obvious spectral signals were detected in a certain range, indicating that effective excitations can be realized as long as the target material is set within the plasma, which greatly reduces the requirement for the spatial position the target material to be provided at.

EXAMPLE 2

Durations of a Plasma Grating and Filament

Figure 6:
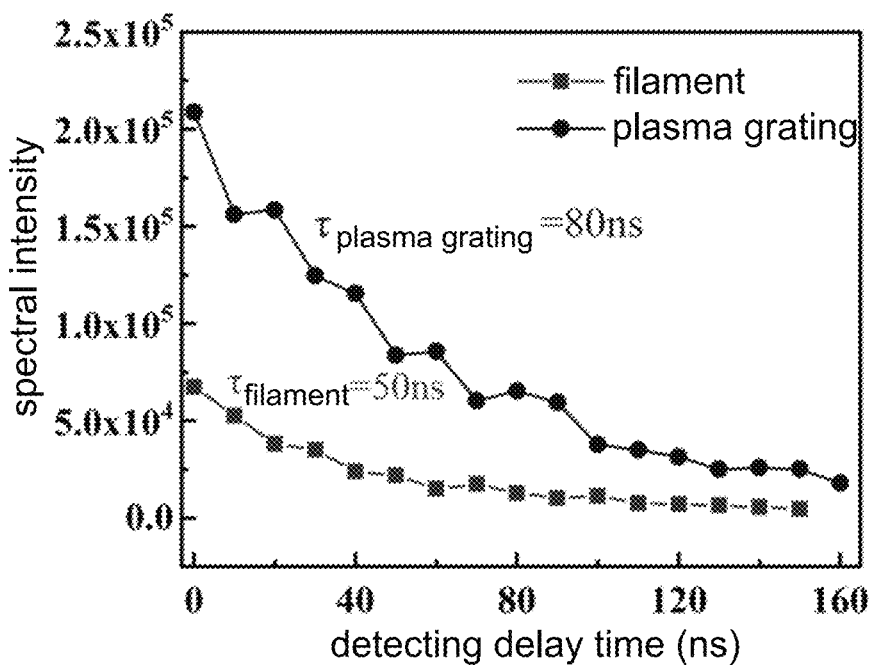
FIG. 6 is a graph showing an estimated duration of a plasma grating.

The increasing amount of plasmas further lengthens the duration thereof. FIG. 6 shows a relationship between spectral intensity of the plasma and a detecting delay time. As shown in FIG. 6, taking a delay time which is 1/e of the delay time corresponding to the spectral intensity being 0 to characterize the duration of the plasma, it can be obtained that the duration of the plasma grating was about 80 ns, while that of the single filament was about 55 ns. That reflects the stronger optical power density as well as higher electron density in the plasma grating, which can well help the excitation on the target material.

EXAMPLE 3

Figure 8:
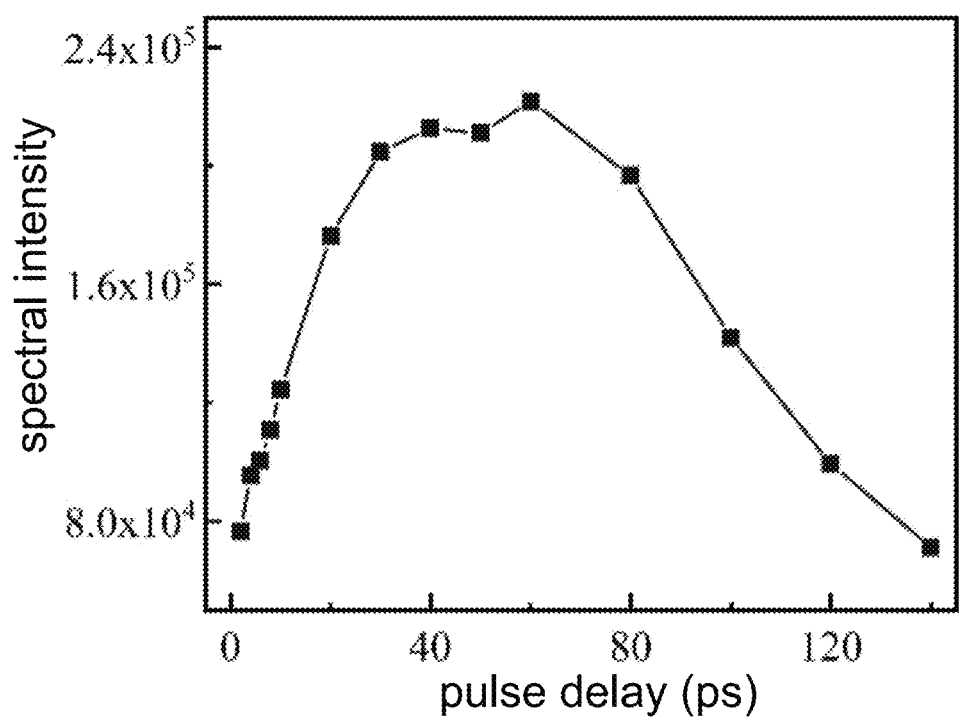
FIG. 8 is a graph showing that a pulse delay between a pre-pulse and a plasma grating affects spectral intensity to excite a target material.

Influence of an Interval Between a Pre-Pulse and Post Pulses on Spectral Intensity of Plasma A femtosecond filament was used as a pre-pulse to assist the subsequent formation of the plasma grating. By analyzing the plasmas excited with different pulse delay (time interval), as shown in FIG. 8, when the pulse delay gradually increased, the spectral intensity rose first, and reached to the maximum value at about 40 ps-80 ps, indicating that the plasmas formed with this range can well assist the formation of the femtosecond plasma grating to achieve a better excitation on the target material. Moreover, there is not a demanding control required for the pulse delay, which in the range of 40 ps-80 ps could present good excitation effect. In addition, the pre-pulse may be a picosecond pulse output by a high-energy picosecond laser device.

EXAMPLE 4

Figure 11:
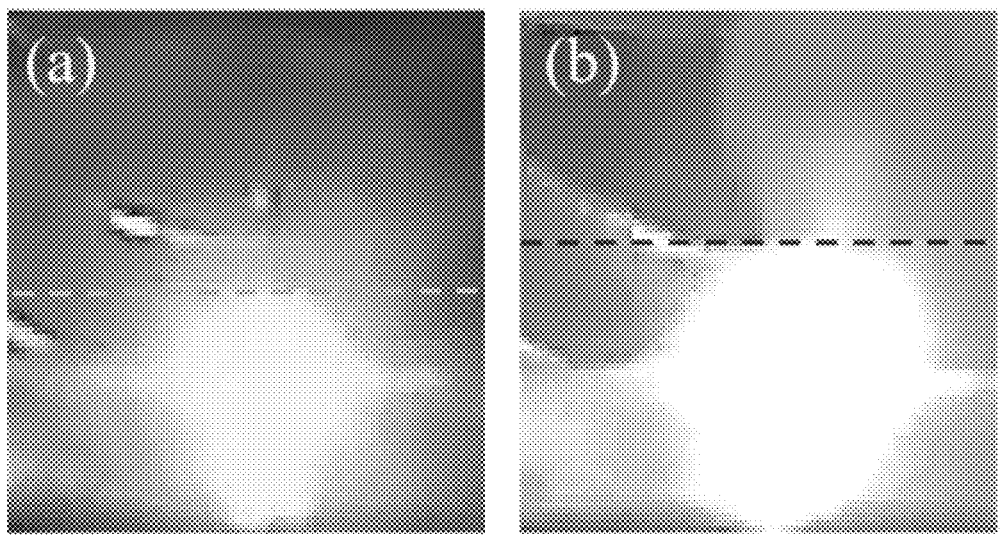

Excitations Comparison on a Target Material by a Filament and by a Plasma Grating FIG. 11 shows a comparison between excitations on a target material by a filament and by a plasma grating, in which FIG. 11a is a photograph of an excitation by the filament while FIG. 11b is a photograph of an excitation by the plasma grating. The laser energy was controlled to be 2 mJ with other conditions remained the same in the two excitations. It can be seen from FIG. 11 that the plasmas excited by the plasma grating was significantly greater than that excited by the filament, with a significantly increasing spray distance, indicating that the plasma grating can perform an effective excitation on the target material, the plasmas generated during which could be more easily to spray onto the glass substrate to form a film with cooling down.

Figure 12:
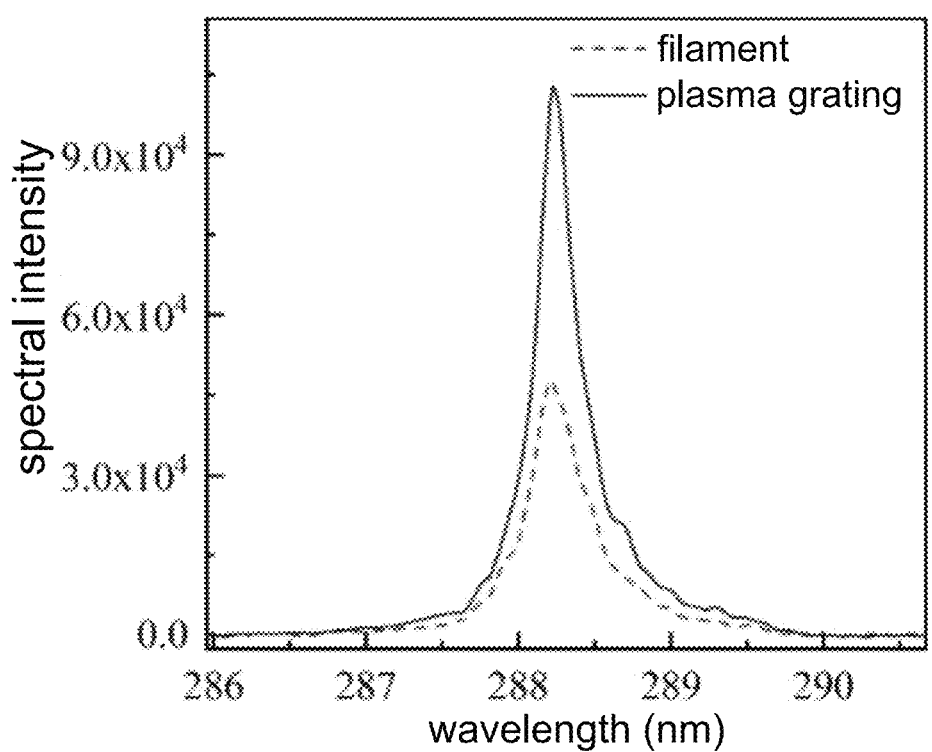
FIG. 12 shows a comparison between plasma spectrums generated in excitations by a single filament and by a one-dimensional plasma grating.

Plasma spectrums generated in excitations by a single filament and by a one-dimensional plasma grating were further obtained, and the compared results are shown in FIG. 12. It can be seen from FIG. 12 that the spectral signal obtained in the excitation to the target material with the plasma grating was significantly higher than that with the filament, which further reflects the excellent performance of the plasma grating to the excitation and the advantages of the super laser deposition technology with the plasma grating provided by Examples of the present disclosure.

The above is only embodiments of the present disclosure, and general knowledge such as the specific technical solutions and/or characteristics commonly known in the solution are not described in detail herein. It should be noted that for those skilled in the art, various modifications and improvements can be made without departing from the technical solution of the present disclosure, which should also be considered as the scope of protection of the present disclosure, and will not affect the effectiveness of the embodiments of the present disclosure and the practicality of the patent. The scope of protection of this application is limited by the appended claims, and the detailed description and other records in the specification can be used to explain the content of the claims.

What is claimed is:

1. A method for coating a film by pulsed laser deposition with a plasma grating, comprising:
   in step 1, providing a substrate and a target material in a vacuum chamber;
   in step 2, generating, by a femtosecond laser device, a femtosecond pulsed laser beam which is split by a beam splitting module so as to form a plurality of femtosecond pulsed laser sub-beams;
   in step 3, performing a first excitation on the target material by one of the split femtosecond pulsed laser sub-beams as a pre-pulse entering the vacuum chamber after focus, so as to generate a first plasma;
   in step 4, synchronizing the rest of the split femtosecond pulsed laser sub-beams as post-pulses with a delay synchronization module to form, after focus, filaments arriving at a surface of the target material simultaneously, to generate the plasma grating in the first plasma generated by the first excitation of the pre-pulse; and
   in step 5, performing a secondary excitation on the target material by the generated plasma grating to generate a second plasma which deposits on the substrate to form the film partially after reaching onto the substrate, and moving the target material relative to the substrate so as to form the film in a large area by deposit.

2. The method according to claim 1, wherein in the step 2, the split femtosecond pulsed laser sub-beam possesses single pulse energy greater than 0.5 mJ, a repetition frequency of 1 kHz-1 MHz, a femtosecond pulse width of 10-500 fs, and center wavelengths of 200-400 nm of the ultraviolet band, 400-700 nm of the visible band and 700-2500 nm of the infrared band.

3. The method according to claim 1, wherein in the steps 3 and 4, an interval between the first excitation of the pre-pulse and the second excitation of the post-pulse is 1 ps to 100 ns.

4. The method according to claim 1, wherein in the step 4, the filaments form an included angle of 5-20°.

5. The method according to claim 1, wherein in the step 4, a spatial length of the plasma grating is 1 mm.

6. The method according to claim 1, wherein in the step 5, a distance between the substrate and the target material is 1-5 cm, the substrate is controlled to move at a speed of 20-30 mm/s relative to the target material.

7. The method according to claim 1, wherein the vacuum chamber is provided with a protective gas, wherein the protective gas is argon.

8. The method according to claim 1, wherein the beam splitting module comprises a plurality of beam splitters.

9. The method according to claim 1, wherein the delay synchronization module comprises a plurality of reflectors and lenses.

* * * * *